United States Patent
Ludwig et al.

(10) Patent No.: US 12,531,468 B2
(45) Date of Patent: Jan. 20, 2026

(54) HIGH VOLTAGE CASCADE

(71) Applicant: Siemens Healthineers AG, Forchheim (DE)

(72) Inventors: Patrick Ludwig, Erlangen (DE); Michael Kraus, Forchheim (DE)

(73) Assignee: SIEMENS HEALTHINEERS AG, Forchheim (DE)

( * ) Notice: Subject to any disclaimer, the term of this patent is extended or adjusted under 35 U.S.C. 154(b) by 22 days.

(21) Appl. No.: 18/415,217

(22) Filed: Jan. 17, 2024

(65) Prior Publication Data

US 2024/0250601 A1 Jul. 25, 2024

(30) Foreign Application Priority Data

Jan. 20, 2023 (EP) ..................... 23152629

(51) Int. Cl.
*H02M 1/00* (2007.01)
*H05K 1/02* (2006.01)
*H05K 1/14* (2006.01)

(52) U.S. Cl.
CPC .......... *H02M 1/007* (2021.05); *H05K 1/0254* (2013.01); *H05K 1/141* (2013.01)

(58) Field of Classification Search
CPC ...... H02M 1/007; H05K 1/0254; H05K 1/141
See application file for complete search history.

(56) References Cited

U.S. PATENT DOCUMENTS

| | | | | |
|---|---|---|---|---|
| 6,201,359 B1 * | 3/2001 | Raets | ..................... | H02M 7/103 315/411 |
| 2010/0072971 A1 * | 3/2010 | Nuebling | ................ | H02M 1/08 323/299 |

FOREIGN PATENT DOCUMENTS

| | | |
|---|---|---|
| CN | 115021585 A | 9/2022 |
| JP | S4912424 U | 2/1974 |
| JP | S5125737 A | 3/1976 |
| JP | S5678373 A | 6/1981 |
| JP | 2004048905 A | 2/2004 |
| JP | 2008011632 A | 1/2008 |

* cited by examiner

*Primary Examiner* — Rexford N Barnie
*Assistant Examiner* — Duc M Pham
(74) *Attorney, Agent, or Firm* — Harness, Dickey & Pierce, P.L.C.

(57) ABSTRACT

Stage outputs of a respective cascade half stage of the high voltage cascade are connected to stage inputs of the respective next cascade half stage of the high voltage cascade. Diode circuits are arranged on first additional circuit boards, which are connected electrically and mechanically to a main board of the high voltage cascade. The first additional circuit boards are oriented orthogonally to the main board and follow on sequentially from one another corresponding to the electrical sequence of the cascade half stages. Capacitor circuits of the cascade half stages are arranged to the side next to the first additional circuit boards on the main board, are arranged corresponding to the electrical sequence of the cascade half stages, and alternate on sides of the first additional circuit boards.

20 Claims, 6 Drawing Sheets

HIGH VOLTAGE CASCADE

CROSS-REFERENCE TO RELATED APPLICATION(S)

The present application claims priority under 35 U.S.C. § 119 to European Patent Application No. 23152629.4, filed Jan. 20, 2023, the entire contents of which is incorporated herein by reference.

FIELD

One or more example embodiments of the present invention start out from a high voltage cascade,
  wherein the high voltage cascade has input terminals, via which an input voltage is supplied to the high voltage cascade, and has output terminals, via which an output voltage is emitted,
  wherein the high voltage cascade has a number of cascade half stages,
  wherein the cascade half stages have respective stage inputs, respective stage outputs and a respective capacitor circuit between the respective stage inputs and the respective stage outputs and have a respective diode circuit,
  wherein the stage inputs of the first cascade half stage are connected to the input terminals, one of the stage outputs of the last cascade half stage is connected to one of the output terminals and furthermore the stage outputs of a respective cascade half stage are connected to the stage inputs of the next cascade half stage in each case, so that the cascade half stages form an electrical series of cascade half stages.

BACKGROUND

Independent of the grammatical term usage, individuals with male, female or other gender identities are included within the term.

High voltage cascades are generally known. Purely by way of example the reader can be referred to what is known as the Villard circuit. The Greinacher circuit and the Delon circuit can also be mentioned.

SUMMARY

In many cases a high voltage must be provided in order to be able to operate specific facilities correctly. For example high voltages are needed for the operation of x-ray tubes, particle accelerators, electrostatic dust filters, ionizers and more besides. The high voltage-depending on application case—can lie in the range of a few kV to a range of several MV.

The technology for generating such a high voltage—especially in the form of the circuits mentioned above—is established and proven. It is a disadvantage however that the high voltage cascades often need a large amount of installation space.

In some cases the amount of installation space required is not a problem. Examples of such application cases are in particular particle accelerators and industrial applications. In other cases a compact design of the high voltage cascade is essential. Examples of such application cases are in particular x-ray tubes in medical installations. A typical example of such a medical installation is a C-arm system. A further typical example is a CT system. In both cases the x-ray tube of the medical system is arranged in a mobile element, so that the high voltage cascade must also be arranged in the mobile element.

An object of one or more embodiments of the present invention include creating a high voltage cascade that only requires a small amount of installation space.

At least this object is achieved by a high voltage cascade with the features of, for example, the independent claim(s). Advantageous embodiments of the high voltage cascade are the subject matter of the dependent claims.

In accordance with an embodiment of the present invention a high voltage cascade of the type stated at the outset is embodied in that,
  the diode circuits of the cascade half stages are each arranged on a separate first additional circuit board of the high voltage cascade, which is connected electrically and mechanically to a main board of the high voltage cascade,
  the first additional circuit boards are oriented orthogonally to the main board and accordingly the electrical sequence of the cascade half stages are arranged, viewed in a direction in which they extend, sequentially following on from one another,
  the first additional circuit boards are oriented essentially orthogonally to the direction in which they extend and
  the capacitor circuits of the cascade half stages are arranged to the side next to the first additional circuit boards on the main board and are arranged according to the electrical sequence of the cascade half stages and alternating on the one and on the other side of the first additional circuit boards.

A very compact layout is achieved through this that, despite this, still has a high dielectric strength.

The input voltage, i.e. the voltage supplied to the high voltage cascade, is an AC voltage. As a rule it is itself already a high voltage (i.e. a voltage above 1000 V). In many cases the input voltage is tapped off from the output side of a transformer. The voltage supplied to the transformer on the input side is in this case often a low voltage, i.e. a voltage below 1000 V. For example it can involve a usual household voltage (100 V, 110 V, 230 V, in exceptional cases 400 V).

The output voltage is a DC voltage, the value of which lies above the peak value of the input voltage, mostly far above the peak value of the input voltage. The output voltage can for example lie in the range between 80 kV and 150 kV. It can also have another value however.

Due to their functionality, the main board and the first additional circuit boards must be high-voltage resistant. The first additional circuit boards can be soldered to the main board. As an alternative they can for example be plugged into the main board. Both the requirement to be high-voltage resistance and also the possible types of connection to the main board (soldered or plugged-in) also apply to any further additional circuit boards that might be present.

The number of first additional circuit boards can be chosen as required. For example it can lie at around 10, 20 or 30. Values of below 10 or above 30 are also possible. The number of first additional circuit boards is an even number however.

The diode circuits, i.e. the circuits arranged on one of the first additional circuit boards, mostly comprise a series circuit of diodes. The number of diodes connected in series often lies between 20 and 100, in particular between 40 and 70. The number of diodes connected in series can be greater or less than the stated values however. Furthermore other embodiments are possible. For example diode circuits can have a number of spurs, wherein a number of diodes are connected in series in each spur. The connection of the spurs to one another—is for example parallel to one another (in the electrical sense)—depending on the situation in the individual case, can be undertaken by a corresponding routing of conductor tracks on the first additional circuit boards or by a corresponding routing of conductor tracks on the main board.

The term "oriented essentially orthogonally to the direction of extension" is also intended to include smaller deviations for the exact orthogonality as well. A smaller deviation is present when and as long as the angle between the direction of extension and the normal of the respective first additional circuit board amounts to a maximum of 15°. Often the angle is even far less than 15°, for example a maximum of 12°, a maximum of 10° or a maximum of 8°. The only essentially orthogonal orientation, relative to the direction of extension, of the first additional circuit boards is also contrary to an orientation orthogonal to the main board. This is since this orientation—with the exception of unavoidable imprecisions—is exactly orthogonal.

Preferably the first additional circuit boards are arranged on the main board in a zig-zag arrangement. This embodiment in particular enables a routing of lines of the main board to be achieved in which the lines to capacitor circuits carrying different potentials can be spaced far apart from one another despite the compact design.

In the zig-zag arrangement the first additional circuit boards must by oriented only essentially orthogonally, but not exactly, to the direction of extension. The angle between the direction of extension and the normal of the respective first additional circuit board preferably amounts in this case to at least 3°, in particular to at least 5°. It can also have a greater value, in particular of up to 10° or even of up to 15°.

Preferably first cutouts are inserted into the main board between consecutive first additional circuit boards. This embodiment enables the dielectric strength of the high voltage cascade to be increased. In the case of the zig-zag arrangement of the first additional circuit boards the first cutouts can especially be triangular in shape.

Preferably second cutouts are inserted in the main board in the region of capacitors of the capacitor circuits, so that the respective second cutout is arranged between terminals of the respective capacitor. The dielectric strength of the high voltage cascade can also be increased by this embodiment.

Preferably the high voltage cascade has second additional circuit boards, which are connected electrically and mechanically to the main board. In this case one of the second additional circuit boards is arranged between two consecutive first additional circuit boards in each case and furthermore the respective second additional circuit board is connected to an output potential of the cascade half stage, the component of which is the front first additional circuit board in each case. What is achieved by the second additional circuit boards is that the first additional circuit boards and thus the diode circuits are located in a defined electrical field—by contrast with an electrical field to be set at random. Due to the defined electrical field, above all in the case of a sudden collapse of the output voltage, there are improved discharges of the diode circuits. Thus the operational safety of the high voltage cascade is increased.

The second additional circuit boards, provided the first cutouts are inserted into the main board between the first additional circuit boards, can in particular bridge the first cutouts, i.e. be connected to the main board to the left and right of the respective first cutout.

Due to the situation that the electrical fields for the first additional circuit boards are set by the second additional circuit boards, the second additional circuit boards can also be referred to as field guidance boards, field control boards or potential control boards.

Preferably a further second additional circuit board is arranged following the first additional circuit board of the last cascade half stage, wherein the further second additional circuit board is connected to an output potential of the last cascade half stage. This means that the first additional circuit board, which bears the diode circuit of the last cascade half stage, is also in a defined electrical field.

The second additional circuit boards are furthermore preferably oriented orthogonally to the direction of extension. This in particular simplifies the layout of the main board.

Preferably the high voltage cascade has a third additional circuit board, which is connected electrically and mechanically to the main board. In this case the input terminals are arranged on the third additional circuit board. This embodiment enables the supply of the input voltage to the high voltage cascade to be simplified and optimized.

The third additional circuit board is furthermore preferably oriented orthogonally to the direction of extension. This simplifies in particular the layout of the main board.

As an alternative the third additional circuit board can be arranged, viewed in the direction of extension, on the edge of the main board or in the middle of the main board. In one case the first and where necessary also the second additional circuit boards only extend out from one side of the third additional circuit board, in another case a sequence of first and where necessary also second additional circuit boards extends out from both sides of the third additional circuit boards in each case.

It is possible that the high voltage cascade has at least one fourth additional circuit board, which is connected electrically and mechanically to the main board. In this case the fourth additional circuit board bears a divider circuit. The divider circuit on the one hand has measurement terminals, which are connected in each case to one of the stage inputs and one of the stage outputs—not necessarily of the same cascade half stage. Furthermore the divider circuit on the other hand has output terminals in this case, via which a fraction of a cascade voltage tapped off via the measurement terminals is able to be tapped of as a measurement voltage. Through this embodiment a tapping-off of a measurement voltage is possible in a simple manner. The designation of the tapped-off voltage as cascade voltage and of the output voltage as measurement voltage merely serves for linguistic distinction and also for characterization that the one voltage is tapped off on the high voltage cascade side and the other voltage represents a measurement variable. No further meaning is assigned to the two terms.

As an alternative or in addition it is also possible for the high voltage cascade to have at least one fifth additional circuit board, which is connected electrically and mechanically to the main board. In this case the fifth additional circuit board has a circuit of components via which the capacitor circuits are discharged as soon as the input voltage is no longer being supplied to the high voltage cascade via the input terminals. Through this embodiment, in a constructively simple and also compact manner, the gradual removal of a high voltage, once generated, is guaranteed. The circuit of components can form what is known as a lifesaver circuit. Often the components involve ohmic resistors, which have resistance values of several Megaohms.

Preferably the high voltage cascade has an oil bath, in which the main board and the first additional circuit boards are arranged. This enables the dielectric strength of the high voltage cascade to be increased.

Where present, in addition to the main board and the first additional circuit boards and the second additional circuit boards, the third additional circuit board, the fourth additional circuit boards (here mostly with the exception of the output terminals) and the fifth additional circuit boards are also arranged in the oil bath.

Preferably the main board, viewed in the direction of extension, has a tongue extending in the direction of extension behind the first additional circuit board of the last cascade half stage, wherein one of the output terminals is arranged at the end of the tongue spaced apart from the first additional circuit board of the last cascade half stage. This embodiment enables the dielectric strength of the high voltage cascade to be increased.

Preferably the high voltage cascade is used for supplying electrical energy to an x-ray tube of a medical apparatus, in particular of a C-arm apparatus or a CT apparatus. With such apparatuses in particular there is often only a very small installation space available for the high voltage cascade.

In the present case the supply of electrical energy to the x-ray tube naturally does not mean a "normal" supply of energy, which is needed for example for an x-ray tube with a rotating anode for driving the rotating anode, but the supply of energy that is needed for the creation of the x-ray radiation as such, also for the voltage that is present between cathode and anode of the x-ray tube.

BRIEF DESCRIPTION OF THE DRAWINGS

The characteristics, features and advantages of this invention described above, as well as the manner in which these are achieved, will become clearer and easier to understand in conjunction with the description given below of the exemplary embodiments, which will be explained in greater detail in conjunction with the drawings. Here, as schematic diagrams.

DETAILED DESCRIPTION

Figure 1:
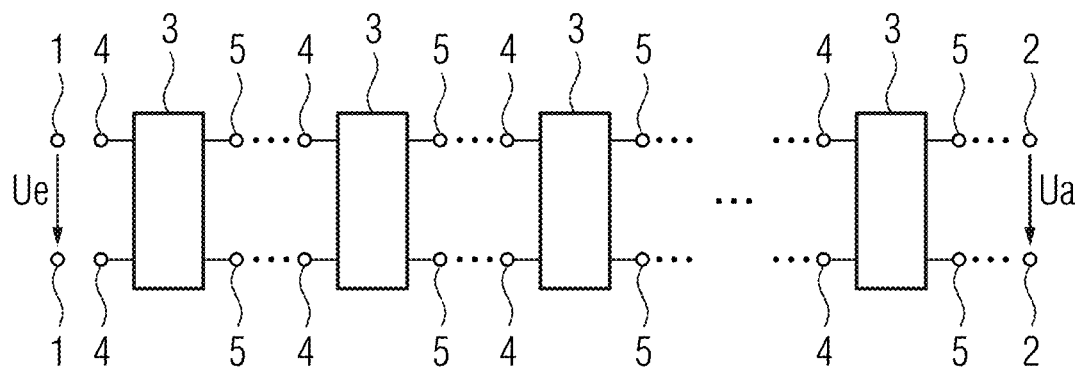
FIG. 1 shows a block diagram of a high voltage cascade.

In accordance with FIG. 1 a high voltage cascade has input terminals 1. An input voltage Ue can be supplied to the high voltage cascade via the input terminals 1. The input voltage Ue is as a rule an AC voltage and a high voltage, i.e. a voltage above 1000 V. The "high voltage" characteristic is not absolutely necessary however.

The high voltage cascade furthermore has output terminals 2. An output voltage Ua is emitted via the output terminals 2. The output voltage Ua is always a DC voltage and is always a high voltage. It is furthermore always greater than the peak value of the input voltage Ue. Often the output voltage Ua lies in the range of around 100 kV. The range of the high voltage is not absolutely required however.

The high voltage cascade furthermore has a number of cascade half stages 3. The cascade half stages 3 follow on from one another in the electrical respect, thus form an electrical sequence of cascade half stages 3. In particular the cascade half stages 3 have respective stage inputs 4 and respective stage outputs 5. The stage inputs 4 of the front-most cascade half stage 3 (i.e. of the first cascade half stage 3) are connected to the input terminals 1. One of the stage outputs 5 of the last cascade half stage 3 is connected to one of the output terminals 2. The other output terminal 2 can be connected to a defined potential as required, in particular by a ground connection. Furthermore, the stage outputs 5 of a respective cascade half stage 3 are connected to the stage inputs 4 of the next cascade half stage 3 in each case.

Where reference is made to the first cascade half stage 3, the second cascade half stage 3 etc. below, this means the respective cascade half stage 3 according to the electrical sequence of cascade half stages 3.

Figure 2:
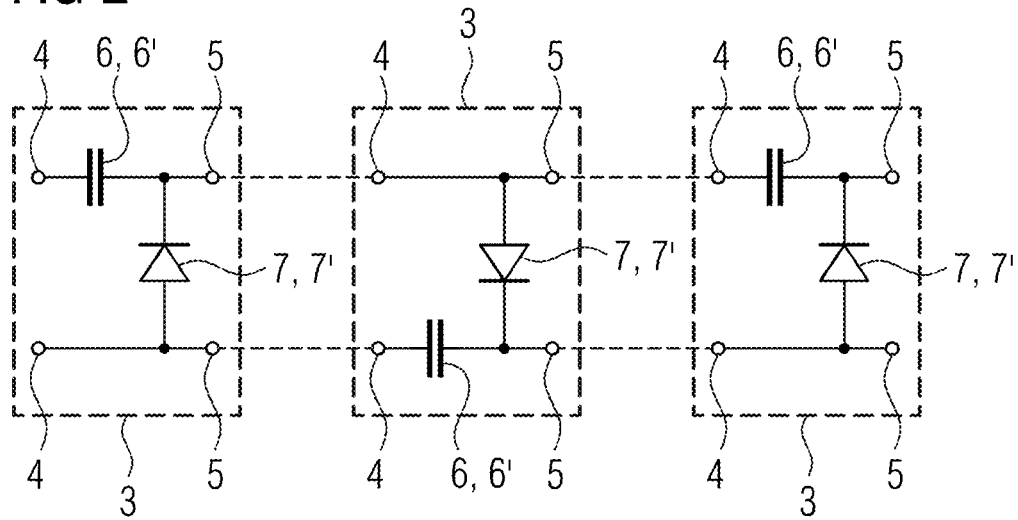
FIG. 2 shows a block diagram of three consecutive cascade half stages.

In accordance with FIG. 2 the cascade half stages 3 have a capacitor circuit 6 and a diode circuit 7 between the respective stage inputs 4 and the respective stage outputs 5. Shown in the diagram in FIG. 2 is only one individual capacitor 6' in each case for the capacitor circuit 6 and one individual diode 7' for the diode circuit 7. This is not to be understood however as a restriction. In principle this can involve any given combination or a series and/or parallel circuit of capacitors 6' or diodes 7'.

Up to this point the electrical structure of the high voltage cascade has been explained. This structure is known as such. Now, in conjunction with the further figures, the mechanical and constructional structure of the high voltage cascade will be discussed. The mechanical and constructional structure represents the core subject matter of the present invention.

Figure 3:
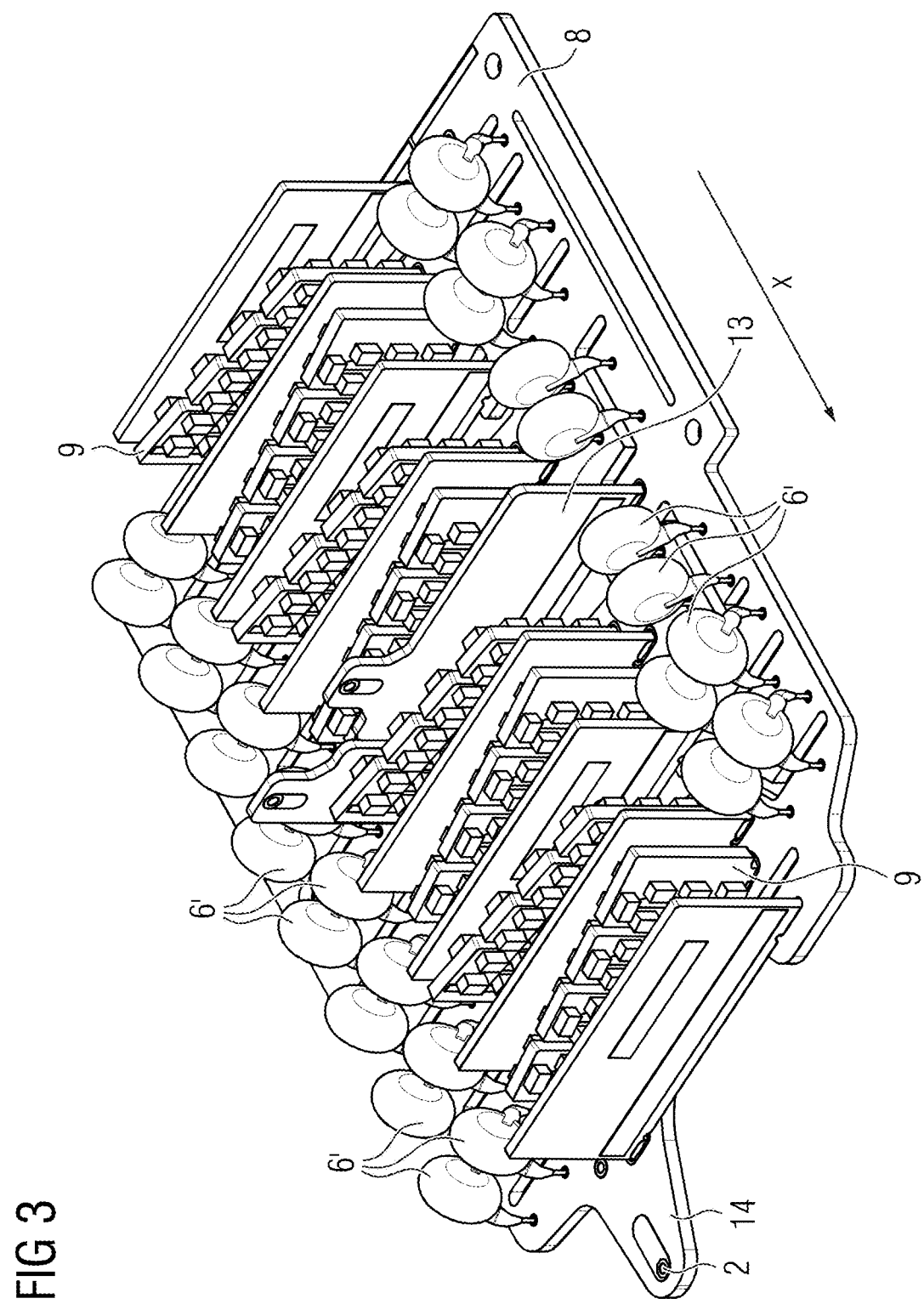
FIG. 3 shows a perspective view of a high voltage cascade.
Figure 4:
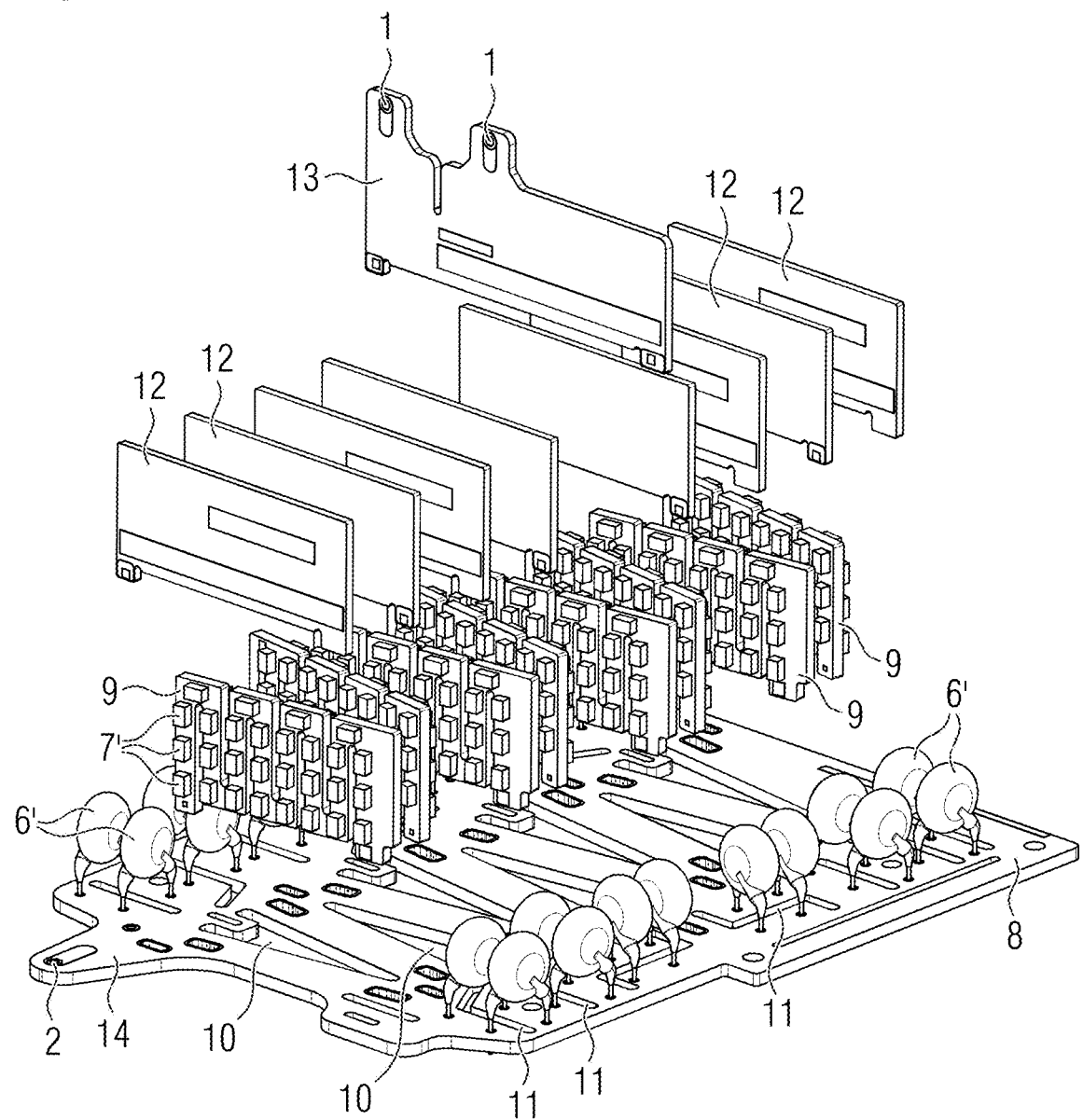
FIG. 4 shows an exploded diagram of the high voltage cascade of FIG. 3.
Figure 5:
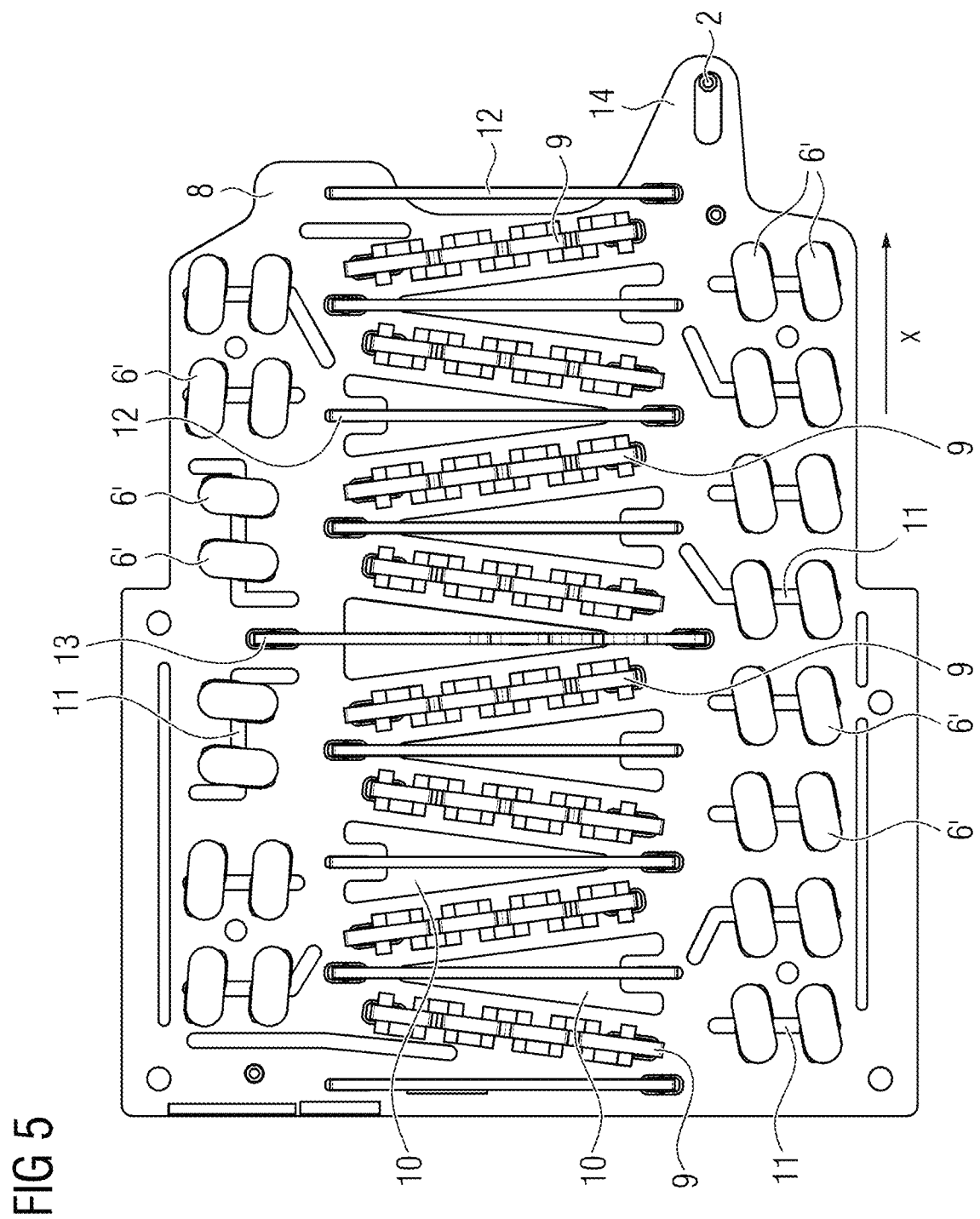
FIG. 5 shows an overhead view of the high voltage cascade of FIG. 3.
Figure 6:
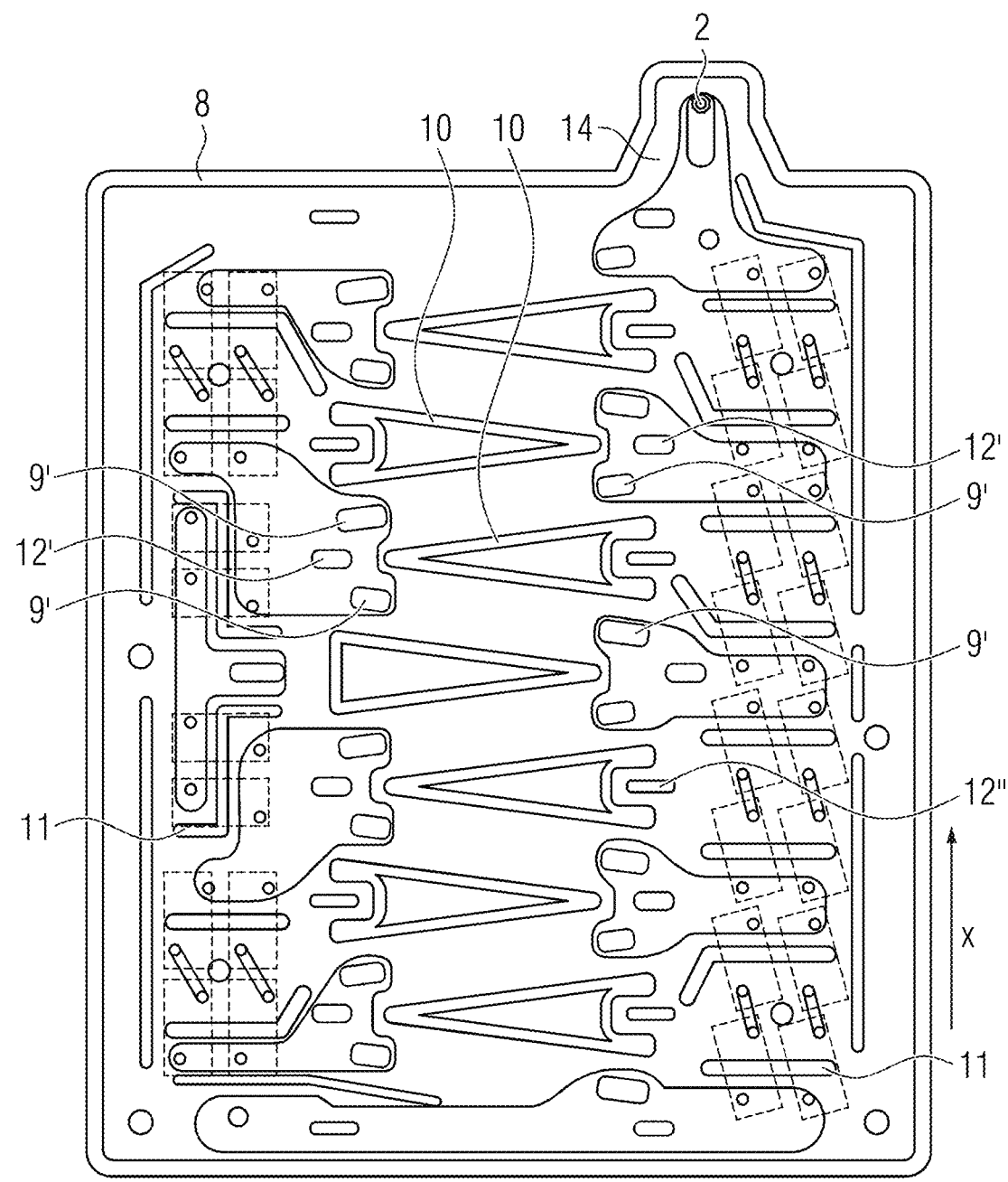
FIG. 6 shows a layout of a main board.

FIGS. 3 to 5 show various views of the same mechanical and constructional embodiment of an inventive high voltage cascade. FIG. 6 shows the associated layout of a main board 8 of the high voltage cascade. The main board 8 serves (inter alia) as a carrier board for further circuit boards. FIGS. 3 to 6 will be explained jointly below.

One group of further circuit boards are first additional circuit boards 9. The designation of these additional circuit boards as first additional circuit boards 9 does not serve to identify a sequence but to make a linguistic distinction between further additional circuit boards still to be introduced. For the further additional circuit boards introduced later, the corresponding designation as second, third additional circuit boards etc. does not serve to identify a sequence but is used to distinguish them linguistically from the other additional circuit boards. In FIGS. 3 to 5, for the sake of clarity, only a few of the first additional circuit boards 9 are labeled with their reference number.

The first additional circuit boards 9 are oriented orthogonally to the main board 8 and are connected electrically and mechanically to the main board 8, i.e. arranged on the main board 8. The corresponding connection points for two consecutive boards of the first additional circuit boards 9 are labeled with the reference character 9' in FIG. 6.

The diode circuit 7 of a cascade half stage 3 is arranged on the first additional circuit boards 9 in each case. A 1:1 assignment exists here as a rule. The number of first additional circuit boards 9 thus matches the number of cascade half stages 3. It can also be seen from the diagrams of FIGS. 3 to 5 that the first additional circuit boards 9 carry a plurality of individual components. Each such component is as a rule a diode 7'. Purely by way of example a few of the diodes are labeled with their reference character 7' in FIG. 4.

The first additional circuit boards 9 follow on from each other sequentially, viewed in a direction of extension x, corresponding to the electrical sequence of the cascade half stages 3. The direction of extension x lies within the plane defined by the main board 8. The additional circuit board 9 on which the diode circuit 7 of the ith cascade half stage 3 is arranged, viewed in the direction of extension x, thus follows directly after the additional circuit board 9 of the (i−1)th cascade half stage 3, wherein i=2, . . . n applies, and n refers to the number of cascade half stages 3. The wording "follows directly after" in this context means that no other first additional circuit board 9 is located between the two first additional circuit boards 9 mentioned. It can be seen that the first additional circuit boards 9 are oriented essentially orthogonally to the direction of extension x. Often, as is particularly clearly evident from FIG. 5, however they form an angle with the direction of extension x that deviates slightly (by a maximum of 15°) from the orthogonal. Such a deviation from the orthogonal is not mandatory however. But it can in particular be sensible when the first additional circuit boards 9, as can also be seen from FIG. 5, are arranged on the main board 8 in a zig-zag arrangement.

In accordance with FIGS. 3 to 6 the capacitor circuits 6 of the cascade half stages 3 are arranged on the main board 8 and are arranged here on the one hand to the side next to the first additional circuit boards 9 and on the other hand corresponding to the electrical sequence of the cascade half stages 3. Furthermore the capacitor circuits 6 are arranged alternating on the one side and the other side of the first additional circuit boards 9. The capacitors 6' of the capacitor circuits 6 of the first, the third, the fifth etc. cascade half stage 3 are thus arranged on the one side of the first additional circuit boards 9, the capacitors 6' of the capacitor circuits 6 of the second, the fourth, the sixth etc. cascade half stage 3 on the other side. In FIGS. 3 to 5, for the sake of clarity, only a few of the capacitors 6' are labeled with their reference character.

A plurality of advantageous embodiments of the high voltage cascade can also be recognized from FIGS. 3 to 6. These embodiments, where they do not build directly and immediately on one another, are able to be realized independently of one another.

Thus, in accordance with FIGS. 3 to 6, first cutouts 10 are inserted in the main board 8. In concrete terms a first cutout 10 is located in each case between two consecutive first additional circuit boards 9. The first cutouts 10 are embodied in the present example essentially in the shape of a triangle. This embodiment is a consequence of the zig-zag shaped arrangement of the first additional circuit boards 9. In FIGS. 4 to 6, for the sake of clarity, only a few of the first cutouts 10 are labeled with their reference character.

Furthermore, in accordance with FIGS. 4 to 6, second cutouts 11 are inserted in the main board 8. The second cutouts 11 are arranged in the area of the capacitors 6' of the capacitor circuits 6. The arrangement is such that the respective second cutout 11 is arranged between terminals of the respective capacitor 6' of the respective capacitor circuit 6. In FIGS. 4 to 6, for the sake of clarity, only a few of the second cutouts 11 are labeled with their reference character.

The designation of the cutouts 10, 11 as first and second cutouts 10, 11, as is the case with the additional circuit boards, does not serve to identify a sequence but linguistically to distinguish the cutouts 10, 11 from one another.

Furthermore the high voltage cascade in accordance with FIGS. 3 to 5 has second additional circuit boards 12 as further circuit boards. In FIGS. 4 and 5, for the sake of clarity, only a few of the second additional circuit boards 12 are labeled with their reference character.

The second additional circuit boards 12 are connected electrically and mechanically to the main board 8, i.e. are arranged on the main board 8. It can be seen that in each case one of the second additional circuit boards 12 is arranged between two first additional circuit boards 9 following on from one another in each case. The respective second additional circuit board 12 is connected to an output potential of the cascade half stage 3, the component of which is the respective front first additional circuit board 9. The corresponding connection points are labeled with reference character 12' in FIG. 6 for a few of the second additional circuit boards 12. The corresponding second additional circuit board 12 is thus connected to one of the stage outputs 5 of the corresponding cascade half stage 3. It can furthermore be seen from FIGS. 3 to 5 that a further second additional circuit board 12 also follows the first additional circuit board 9 of the last cascade half stage 3. This further second additional circuit board 12 is connected to an output potential of the last cascade half stage 3.

The second additional circuit boards 12 are preferably oriented orthogonally to the direction of extension x. The second additional circuit boards 12 do not carry any circuit but merely form separation surfaces for electrical shielding of the first additional circuit boards 9. Therefore, on the side of the main board 8 lying opposite the respective connection point 12' merely a purely mechanical connection between the second additional circuit boards 12 and the main board 8 is necessary. In FIG. 6 one of these purely mechanical connection points is labeled with the reference character 12".

Furthermore the high voltage cascade in accordance with FIGS. 3 to 5 has a third additional circuit board 13 as a further circuit board. The third additional circuit board 13 too is connected electrically and mechanically to the main board 8, i.e. is arranged on the main board 8. The input terminals 1 are arranged on the third additional circuit board 13. The third additional circuit board 13—like the second additional circuit boards 12—is preferably oriented orthogonally to the direction of extension x.

In accordance with FIGS. 3 to 5, viewed in the direction of extension x, the third additional circuit board 3 is arranged centrally, which means that, starting from the third additional circuit board 13 viewed in the direction of extension x, first additional circuit boards 9 (and where necessary also second additional circuit boards 12) follow on from one another both forwards and also backwards. As an alternative the third additional circuit board 13 could be arranged, viewed in the direction of extension x, at the edge of the main board 8.

Finally, it can be seen from FIGS. 3 to 6 that the main board 8, viewed in the direction of extension x, has a tongue 14 behind the first additional circuit board 9 of the last cascade half stage 3, which extends in the direction of extension x away from the said first additional circuit board 9. One of the output terminals 2 is arranged at the end of the tongue 14 spaced apart from this first additional circuit board 9. This output terminal 2 is connected to one of the stage outputs 5 of the last cascade half stage 3.

Figure 7:
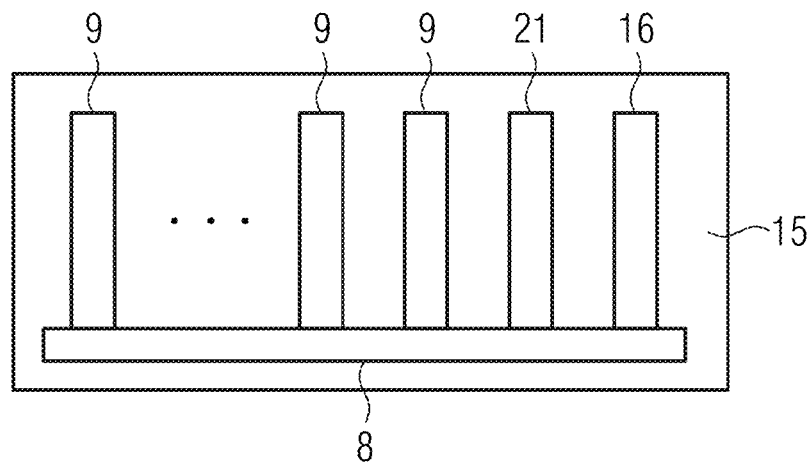
FIG. 7 shows a schematic view of a high voltage cascade from the side.

In accordance with FIG. 7 the high voltage cascade has an oil bath 15. The main board 8 and the first additional circuit boards 9 are arranged in the oil bath 15. Mostly a complete hermetically-sealed encapsulation exists. Where present, the second additional circuit boards 12 and the third additional circuit board 13 are also arranged in the oil bath 15.

In accordance with FIG. 7 the high voltage cascade can also have a fourth additional circuit board 16. When the fourth additional circuit board 16 is present, it is likewise connected electrically and mechanically to the main board 8, i.e. is arranged on the main board 8.

Figure 8:
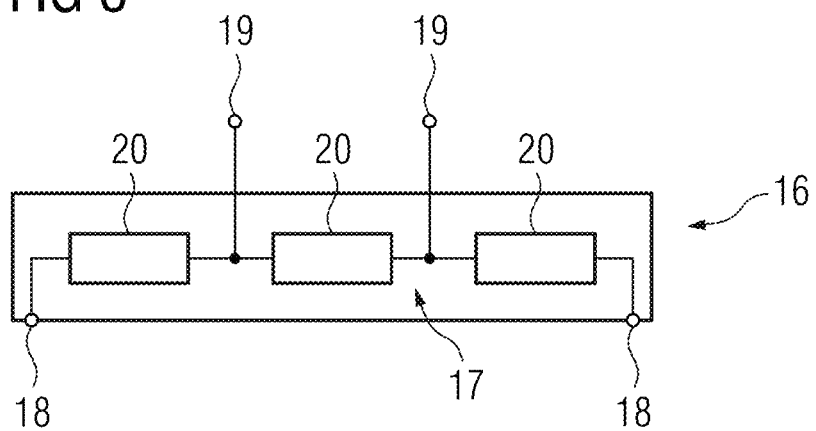
FIG. 8 shows a fourth additional circuit board.

In accordance with FIG. 8 the fourth additional circuit board 16 carries a divider circuit 17. The divider circuit 17 has measurement terminals 18. Each one of the measurement terminals 18 is connected to one of the stage inputs 4 and to one of the stage outputs 5. This can involve a stage input 4 and a stage output 5 of the same cascade half stage 3. It can however also involve a stage input 4 and a stage output 5 of cascade half stages 3 differing from one another. The divider circuit 17 furthermore has output terminals 19. A fraction of a cascade voltage tapped off via the measurement terminals 18 can be tapped off as a measurement voltage via the measurement terminals 18. The ratio of the measurement voltage to the cascade voltage is determined by the resistance values of the resistors 20 of the divider circuit 17.

The fourth additional circuit board 16, where the oil bath 15 is present, is likewise arranged in the oil bath 15. The output terminals 19 are however arranged outside the oil bath 15 as a rule.

Figure 9:
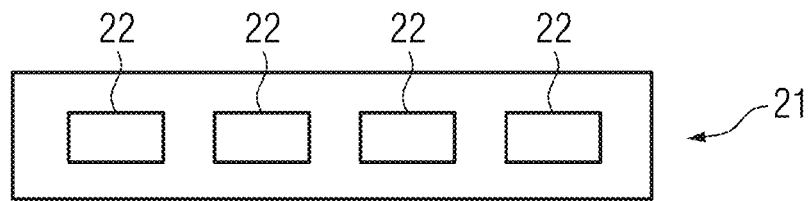
FIG. 9 shows a fifth additional circuit board.

As a rule it is sufficient for a single fourth additional circuit board 16 to be present. More fourth additional circuit boards 16 can also be present however.

Where necessary the high voltage cascade in accordance with FIG. 7 can furthermore also have a fifth additional circuit board 21. When the fifth additional circuit board 21 is present, it is likewise connected electrically and mechanically to the main board 8, i.e. it is arranged on the main board 8. In accordance with FIG. 9 the fifth additional circuit board 21 has a circuit of components 22. The capacitor circuits 6 are discharged via the circuit as soon as the high voltage cascade is no longer being supplied with the input voltage Ue via the input terminals 1. The basic layout and the basic function of such a circuit is known to those skilled in the art. Due to its function it is often referred to as lifesaver circuit.

The high voltage cascade of the present invention is universally applicable. One especially preferred application however is use of the high voltage cascade for the supply of electrical energy to an x-ray tube of a medical apparatus, in particular of a C-arm apparatus or of a CT apparatus.

In summary, the present invention thus relates to the following subject matter:

A high voltage cascade has a number of cascade half stages 3, which have respective stage inputs 4, respective stage outputs 5 and between them a respective capacitor circuit 6 and a respective diode circuit 7. The stage inputs 4 of the first cascade half stage 3 are connected to input terminals 1, via which an input voltage Ue is supplied to the voltage cascade. One of the stage outputs 5 of the last cascade half stage 3 is connected to one or more output terminals 2, via which an output voltage Ua is emitted. Furthermore, the stage outputs 5 of a respective cascade half stage 3 are connected to the stage inputs 4 of the respective next cascade half stage 3. The diode circuits 7 are arranged on first additional circuit boards 9 of the high voltage cascade, which are connected electrically and mechanically to a main board 8 of the high voltage cascade. The first additional circuit boards 9 are oriented orthogonally to the main board 8 and, corresponding to the electrical sequence of the cascade half stages 3, follow on sequentially from one another, viewed in a direction of extension x. The first additional circuit boards 9 are oriented essentially orthogonally to the direction of extension x. The capacitor circuits 6 of the cascade half stages 3 are arranged to the side next to the first additional circuit boards 9 on the main board 8 and are arranged corresponding to the electrical sequence of the cascade half stages 3 and alternating on the one and the other side of the first additional circuit boards 9.

The present invention has many advantages. In particular the arrangement of the diode circuits 7 on the first additional circuit boards 9 produces a very compact design. Furthermore a modular structure is also produced by this. Thus for example—depending on main board 8—a high voltage cascade with four, six, eight etc. cascade half stages 3 can be realized. Also the first additional circuit boards 9 can be replaced by other first additional circuit boards 9. Thus, as required, various main boards 8 with various first additional circuit boards 9 can be built with or without second additional circuit boards 12. Due to the second additional circuit boards 12 the option of field control is furthermore produced in a simple way.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of embodiments. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "on," "connected," "engaged," "interfaced," and "coupled." Unless explicitly described as being "direct," when a relationship between first and second elements is described in the disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of the embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

It is noted that some embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed above. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Although the present invention has been illustrated and described in greater detail by the preferred exemplary embodiment, the present invention is not restricted by the disclosed examples and other variations can be derived herefrom by the person skilled in the art, without departing from the scope of protection of the present invention.

What is claimed is:

1. A high voltage cascade comprising:
   input terminals configured to receive an input voltage for the high voltage cascade;
   output terminals configured to emit an output voltage; and
   a number of cascade half stages, the cascade half stages having respective stage inputs and respective stage outputs, and having a respective capacitor circuit and a respective diode circuit between the respective stage inputs and the respective stage outputs, wherein
   stage inputs of a first cascade half stage are connected to the input terminals,
   a stage output of a last cascade half stage is connected to one of the output terminals,
   stage outputs of each respective cascade half stage are connected to stage inputs of a respective next cascade half stage, so that the cascade half stages form an electrical sequence of cascade half stages,
   the respective diode circuit of each cascade half stage is arranged on a separate first additional circuit board of the high voltage cascade, which is connected electrically and mechanically to a main board of the high voltage cascade,
   the separate first additional circuit boards are oriented orthogonally to the main board and are arranged corresponding to the electrical sequence of the cascade half stages, viewed in a direction of extension, following on sequentially from one another,
   the separate first additional circuit boards are oriented essentially orthogonally to the direction of extension, and
   the respective capacitor circuits of the cascade half stages are arranged to a side next to the separate first additional circuit boards on the main board and are arranged corresponding to the electrical sequence of the cascade half stages and alternating on sides of the separate first additional circuit boards.

2. The high voltage cascade as claimed in claim 1, wherein the separate first additional circuit boards are arranged on the main board in a zig-zag arrangement.

3. The high voltage cascade as claimed in claim 1, wherein first cutouts are introduced in the main board between consecutive ones of the separate first additional circuit boards.

4. The high voltage cascade as claimed in claim 3, wherein second cutouts are introduced in the main board in an area of capacitors of the respective capacitor circuits, such that a respective second cutout is arranged between terminals of a respective capacitor.

5. The high voltage cascade as claimed in claim 1, further comprising:
   second additional circuit boards connected electrically and mechanically to the main board, wherein
   a second additional circuit board of the second additional circuit boards is arranged between two respective separate first additional circuit boards, and
   the second additional circuit board is connected to an output potential of a cascade half stage, a component of which is a front first additional circuit board.

6. The high voltage cascade as claimed in claim 5, wherein a further second additional circuit board is arranged following on from the separate first additional circuit board of the last cascade half stage and the further second additional circuit board is connected to an output potential of the last cascade half stage.

7. The high voltage cascade as claimed in claim 5, wherein the second additional circuit boards are oriented orthogonally to the direction of extension.

8. The high voltage cascade as claimed in claim 5, further comprising:
a third additional circuit board connected electrically and mechanically to the main board, wherein
the input terminals are arranged on the third additional circuit board.

9. The high voltage cascade as claimed in claim 8, wherein the third additional circuit board is oriented orthogonally to the direction of extension.

10. The high voltage cascade as claimed in claim 8, further comprising:
at least one fourth additional circuit board connected electrically and mechanically to the main board, wherein
the at least one fourth additional circuit board includes a divider circuit, the divider circuit having measurement terminals, which are each connected to one of the stage inputs and one of the stage outputs and the divider circuit has output terminals via which a fraction of a cascade voltage tapped off via the measurement terminals is able to be tapped off as a measurement voltage.

11. The high voltage cascade as claimed in claim 10, further comprising:
at least one fifth additional circuit board connected electrically and mechanically to the main board, wherein
the at least one fifth additional circuit board has a circuit of components via which the respective capacitor circuits are discharged when the high voltage cascade is no longer being supplied with the input voltage via the input terminals.

12. The high voltage cascade as claimed in claim 1, further comprising:
an oil bath in which the main board and the separate first additional circuit boards are arranged.

13. The high voltage cascade as claimed in claim 1, wherein the main board, viewed in the direction of extension, has a tongue extending in the direction of extension behind a separate first additional circuit board of the last cascade half stage, and wherein an output terminal, among the output terminals, is arranged at an end of the tongue spaced away from the separate first additional circuit board of the last cascade half stage.

14. The high voltage cascade as claimed in claim 1, wherein the high voltage cascade is configured to supply electrical energy to an x-ray tube of a C-arm apparatus or a CT apparatus.

15. The high voltage cascade as claimed in claim 1, wherein cutouts are introduced in the main board in an area of capacitors of the respective capacitor circuits, such that a respective cutout is arranged between terminals of a respective capacitor.

16. The high voltage cascade as claimed in claim 1, further comprising:
a second additional circuit board connected electrically and mechanically to the main board, wherein
the input terminals are arranged on the second additional circuit board.

17. The high voltage cascade as claimed in claim 1, further comprising:
at least one second additional circuit board connected electrically and mechanically to the main board, wherein
the at least one second additional circuit board includes a divider circuit, the divider circuit having measurement terminals, which are each connected to one of the stage inputs and one of the stage outputs and the divider circuit has output terminals via which a fraction of a cascade voltage tapped off via the measurement terminals is able to be tapped off as a measurement voltage.

18. The high voltage cascade as claimed in claim 1, further comprising:
at least one second additional circuit board connected electrically and mechanically to the main board, wherein
the at least one second additional circuit board has a circuit of components via which the respective capacitor circuits are discharged when the high voltage cascade is no longer being supplied with the input voltage via the input terminals.

19. The high voltage cascade as claimed in claim 1, wherein the high voltage cascade is configured to supply electrical energy to an x-ray tube of a medical apparatus.

20. The high voltage cascade as claimed in claim 5, further comprising:
at least one third additional circuit board connected electrically and mechanically to the main board, wherein
the at least one third additional circuit board includes a divider circuit, the divider circuit having measurement terminals, which are each connected to one of the stage inputs and one of the stage outputs and the divider circuit has output terminals via which a fraction of a cascade voltage tapped off via the measurement terminals is able to be tapped off as a measurement voltage.

\* \* \* \* \*